United States Patent
Kanamori

[11] Patent Number: 6,083,816
[45] Date of Patent: Jul. 4, 2000

[54] SEMICONDUCTOR DEVICE AND METHOD OF MANUFACTURING THE SAME

[75] Inventor: Jun Kanamori, Tokyo, Japan

[73] Assignee: Oki Electric Industry Co. Ltd., Tokyo, Japan

[21] Appl. No.: 09/168,897

[22] Filed: Oct. 9, 1998

[30] Foreign Application Priority Data

Nov. 28, 1997 [JP] Japan ................................. 9-343974

[51] Int. Cl.$^7$ ............................................. H01L 21/3205
[52] U.S. Cl. .......................... 438/585; 438/595; 438/669; 438/671; 438/763
[58] Field of Search ..................... 438/586, 587, 438/591, 595, 303, 740, 744, 757, 265, 763, 585, 588, 669, 671

[56] References Cited

U.S. PATENT DOCUMENTS

| | | | |
|---|---|---|---|
| 4,818,715 | 4/1989 | Chao ........................................ | 438/586 |
| 5,162,884 | 11/1992 | Liou et al. ................................. | 438/591 |
| 5,304,504 | 4/1994 | Wei et al. ................................. | 438/303 |
| 5,384,287 | 1/1995 | Fukase ..................................... | 438/303 |
| 5,424,240 | 6/1995 | Han ......................................... | 438/446 |
| 5,468,665 | 11/1995 | Lee et al. ................................. | 438/231 |
| 5,516,713 | 5/1996 | Hsue et al. ............................... | 438/261 |
| 5,585,295 | 12/1996 | Wu .......................................... | 438/595 |
| 5,677,206 | 10/1997 | Lee et al. ................................. | 438/591 |
| 5,804,458 | 9/1998 | Tehrani et al. ........................... | 438/595 |
| 5,880,008 | 3/1999 | Akiyama et al. ........................ | 438/585 |
| 5,880,015 | 3/1999 | Hata ........................................ | 438/585 |
| 5,923,977 | 7/1999 | Ahmad et al. ........................... | 438/587 |

FOREIGN PATENT DOCUMENTS 5-13434  1/1993  Japan .
6-140517  5/1994  Japan .

OTHER PUBLICATIONS

"Scaling of a Polysilicon Etch Stop Process for Boardless Contacts in Deep Submicron Devices"; J. Gambino, et al; Jun. 7–8, 1994 VMIC Conference; pp. 386–388.

"A Margin–Free Contact Process Using an $Al_2O_3$ Etch–Stop Layer For High Density Devices"; T. Fukase et al; Apr./1992; pp. 837–839.

*Primary Examiner*—Carl Whitehead, Jr.
*Assistant Examiner*—Khanh Duong
*Attorney, Agent, or Firm*—Venable; Robert J. Frank

[57] ABSTRACT

A gate dielectric film 102, gates 104a formed of polysilicon, an offset oxidation film 106a formed of silicon nitride, and an etching stopper nitride film 108a formed of silicon nitride are sequentially formed on a silicon substrate 100, and side walls 110 formed of silicon nitride are formed on side surfaces of the offset oxidation film 106a and the etching stopper nitride film 108a. Since an oxidation polysilicon film 112 having better insulating characteristics than silicon nitride is formed on the side surfaces of the gates 14a by oxidation processing, the cross sectional thickness of the oxidation polysilicon film 112 can be made thin. A sum value of two times the cross sectional width of the etching stopper nitride film 108a and the cross sectional width of the side walls 110 is larger than the cross sectional width of the gates 104a, and the gates 104a are not etched when forming contact holes 116.

6 Claims, 7 Drawing Sheets

SEMICONDUCTOR DEVICE AND METHOD OF MANUFACTURING THE SAME

BACKGROUND OF THE INVENTION

1. Technical Field

The present invention relates to a semiconductor device and method of manufacturing the same, and particularly to a semiconductor device provided with a plurality of electrodes formed on a semiconductor substrate and an insulating film for insulating each electrode. The insulating film protects each electrode from etching at the time of forming contact holes in a self aligned manner at small narrow spaces between adjoining electrodes.

2. Related Art

Recently, the integration density of semiconductors has improved rapidly, and accompanying this rapid increase one technical demand that has arisen is making the various patterns forming the semiconductor finer in detail. For example, in a semiconductor memory device it is necessary to form cell structures that are extremely small, for instance having half micron or quarter micron units. In order to satisfy such demands it is necessary to reduce the distance between each gate (electrode) formed on a semiconductor substrate, and further, when contact holes are formed between each gate it is necessary to make these contact holes finer. Accordingly, using only conventional photolithography techniques that have been used up to now, positioning accuracy of contact holes is limited, and it is difficult to make ultra-fine contact holes. Recently, a self aligning contact structure (hereinafter referred to as "SAC structure") has been adopted in semiconductor devices, and a technique has been provided for forming ultra-fine contact holes in the small narrow spaces between each gate, without controlling positional accuracy when using photo lithography.

Now, referring to FIG. 8, a semiconductor device adopting a general SAC structure will be described. As shown in the drawing, this semiconductor device has gates 14 of polysilicon formed on a semiconductor silicon substrate (hereinafter called a silicon substrate) 10, via gate dielectric films 12, and offset CVD oxidation films (hereinafter called offset oxidation films) 18 of silicon oxide ($SiO_2$) are formed on these gates 14. Etching stopper nitride films 20 of silicon nitride ($Si_3N_4$) are formed on the offset oxidation films 18. Integrally formed side walls 22 of silicon nitride, the same material as the etching stopper nitride films 20, are formed from a side surface of the etching stopper nitride films 20, via the side surfaces of the offset oxidation films 18 to side surfaces of the gates 14. Similarly to the etching stopper nitride films 20, the side walls 22 also function as etching stopper films. Inter layer insulation films 16 are also formed covering the gates 14.

When making contact holes 24, the etching stopper nitride film 20 as described above and the side walls 22 function as etching stopper layers, and protect against etching of the gates 14. Inter layer insulation films penetrate between the gates 14 in a self aligning manner, and the contact holes 24 are formed communicating with the silicon substrate 10.

In order to reduce the distance between each gate 14, it is necessary to make the cross sectional width of the side walls 22 formed on the side surfaces of the gates 14 relatively narrow. However, with the nature of the silicon nitride constituting the side walls 22, if the cross sectional width of the side walls 22 is made, for example, 50 nm or less, the insulation property will be lowered, and it will be easy for so called leakage current to flow between the gates 14 and contact portions formed in the contact holes 24. As a result, limitations naturally arise with reducing the cross sectional width of the side walls 22, and it is difficult to further reduce the distance between each gate 14.

SUMMARY OF THE INVENTION

The present invention solves the above described problems in the related art, and a first object of the present invention is to provide a novel and improved semiconductor device that prevents the flow of leakage current between electrodes and contact portions, makes the cross sectional width of a side portion insulation film for insulating electrode side surfaces relatively narrow, and enables reducing of the distance between adjacent electrodes, and a method of manufacturing such a semiconductor device.

A second object of the present invention is to provide a novel and improved semiconductor device having upper portions of electrodes, as well as electrode side surfaces, insulated by nitride film, enabling more effective insulation of the electrodes, and a method of manufacturing such a semiconductor device.

A third object of the present invention is to provide a novel and improved semiconductor device, having electrode side surfaces insulated by side portion insulating films formed of nitride film that does not include impurities, enabling increased insulation of side portion insulation films, and a method of manufacturing such a semiconductor device.

A fourth object of the present invention is to provide a novel and improved semiconductor device, having electrode shoulder portions, as well as electrode side surfaces and upper portions, insulated by insulating films, enabling more effective insulation of the electrodes, and a method of manufacturing such a semiconductor device.

In the above conventional semiconductor device and method of manufacturing the semiconductor device, as has been described, the distance between gates 14 is made narrow facilitating poor alignment at the time of photolithography processing. Also, because the inner diameter of contact holes 24 is relatively large compared to the distance between gates 14, the contact holes 24 are formed overlapping the gates 14. As a result, like the above described SAC structure, if the side surfaces of the gates 14 are not insulated by a nitride film the gates 14 will be etched when forming the contact holes 24.

The present invention solves the above described problem in the related art, and a fifth object of the present invention is to provide a novel and improved semiconductor device that enables the prevention of etching of the electrodes when forming the contact holes, even if the electrode side surfaces are insulated by a side portion insulating film formed of oxidation film, and a method of manufacturing such a semiconductor device.

In the above conventional semiconductor device and method of manufacturing the semiconductor device, when etching is carried out to form the contact holes 24, fluoro carbon gas is generally used as a main gas, but when etching is carried out using fluoro carbon gas, depending on the etching conditions, the etching stopper nitride film 20 and side walls 22 etc. are also etched.

The present invention solves the above described problem in the related art, and a sixth object of the present invention is to provide a novel and improved semiconductor device, that prevents etching of an upper insulation film, even if etching is carried out using fluoro carbon gas when forming the contact holes, preventing damage to the electrodes, and a method of manufacturing such a semiconductor device.

In the above conventional semiconductor device and method of manufacturing the semiconductor device, an offset oxidation film 18 is formed between the gates 14 and the etching nitride films 20, and the insulating property of the upper portion of the gates 14 is increased, but depending on the semiconductor device it is sometimes not possible to form this offset oxidation film 18.

The present invention solves the above described problem in the related art, and a seventh object of the present invention is to provide a novel and improved semiconductor device, which enables efficient insulating of the electrodes and reducing of the distance between the electrodes, together with prevention of etching of electrodes when forming the contact holes, even when there is no offset nitride film formed between the electrodes and an upper insulation film, and a method of manufacturing such a semiconductor device.

In order to solve the above described problems, according to a first aspect of the present invention, there is provided a semiconductor device having a plurality of electrodes formed on a semiconductor substrate, and an insulating film for insulating each electrode to protect each electrode from etching at the time of forming contact holes in a self aligned manner at small narrow spaces between adjoining electrodes, wherein the insulating film comprises an upper insulation film and a side insulation film formed in respective separate processes, the maximum cross sectional width of the upper insulation film being wider than the maximum cross sectional width of each electrode.

With this construction, because each electrode is insulated by an upper insulation film and a side insulation film formed in respective separate processes, the upper insulation film and the side insulation film can be formed of different materials according to their respective functions. As a result, if the upper insulation film is made of a material having excellent etching resistant characteristics, etching of the electrodes can be prevented during formation of the contact holes. Further, if the side insulation film is made of a material having excellent insulation characteristics, such as an oxidation film, etc., no leakage current will flow between the electrodes and the contact portions, even if the cross sectional width of the side insulation film is made relatively narrow, and the distance between each electrode can be made narrow. Still further, since the upper part of each electrode is insulated by an upper insulation film having a maximum cross sectional width wider than the maximum cross sectional width of these electrodes, the above described etching is prevented by the upper insulation film only and there is no damage to the electrodes. At the same time, the etching stopping function of the side insulating layer can be reduced. As a result, the selected width of the material forming the side insulation film can be increased.

Further, if the upper insulation film is a silicon nitride film (Si3N4), for example, the above described upper insulation film can be formed without significantly modifying treatment conventional.

The upper insulation film can also be a BST film, or a PZT film. Fluoro carbon gas is generally used as the main processing gas when carrying out etching to form contact holes, but the above mentioned BST film and PZT film are difficult to etch even in a process that uses fluoro carbon gas, and they function excellently as etching stoppers. Accordingly, if these BST and PZT films having excellent etching resistance are adopted as the upper insulation film, the cross sectional thickness of this upper insulation film can be made relatively thin, allowing a wide process margin when carrying out the above etching. In this specification, BST refers to a composite oxide comprising Barium (Ba), strontium (Sr) and titanium (Ti), while PZT refers to a composite oxide comprising lead (Pb), Zirconium (Zr) and titanium (Ti).

If the side insulation film is an oxidation film formed by subjecting the electrode surfaces to oxidation treatment, the insulating property of the side insulation film is improved, and no leakage current will flow between the electrodes and the contact portions. As a result, the cross sectional width of the side insulation film can be made relatively narrow, and the distance between electrodes can be made narrow. Also, because the side insulation film can be made from part of the electrodes, the side surface of each electrode can be easily and uniformly insulated by the oxidation film.

Further, if the side insulation film is a CVD oxidation film that has been adhered on the surface of the electrodes, for example, it is possible to insulate the side surface of the electrodes with an oxidation film containing no impurities, and it is possible to carry out insulation of the electrodes more reliably. As a result, it is possible to produce a high reliability element in which leakage current does not occur, even if the cross sectional width of the side insulation film is relatively small.

If an offset oxidation film is formed between the electrodes and the upper insulation film, it is possible to insulate the upper surfaces of the electrodes, as well as the side surfaces, using an oxidation film having good insulation properties, and the electrodes can be reliably insulated. Also, if an exposed surface of the offset oxidation film is insulated by the upper insulation film, neither the electrodes nor the offset oxidation layer will be etched when forming the contact holes, and there will be no destruction of insulation. Further, if the exposed surface of the offset oxidation film is insulated by the side insulation film, then not only will the side surfaces and upper surfaces of the electrodes be insulated by the side insulation film and the upper insulation film, but the shoulder portions of the electrodes can also be insulated by the oxidation film, and the electrodes can be even more reliably insulated.

According to another aspect of the present invention, there is provided a method of manufacturing a semiconductor device, comprising the steps of forming an upper insulation film layer on an upper portion of an electrode layer formed on a semiconductor substrate, patterning the upper insulation film layer to form an upper insulation film, increasing the cross sectional width of the upper insulation film, forming electrodes by etching the electrode layer using the increased width upper insulation film as a mask, and forming a side insulation film on exposed surfaces of the electrodes.

With this construction, the upper insulation film is not formed on exposed surfaces of the electrodes, because the cross sectional width of the upper insulation film is enlarged before forming the electrodes. Also, since the side insulation film is formed on exposed surfaces of the electrodes after the electrodes have been formed from the electrode layer, the upper insulation film and the side insulation film can be made from different materials according to their respective functions. As a result, if the upper insulation film is made from a material having good etching resistance, etching of the electrodes can be prevented when forming the contact holes. Also, if the side insulation film is formed from oxidation film having good insulating properties, leakage current can be prevented from flowing between the electrodes and the contact portions. As a result, since the cross sectional width of the side insulation film can be made relatively narrow, the distance between electrodes can also be made narrow.

According to yet another aspect of the present invention, there is provided a method of manufacturing a semiconductor device, comprising the steps of forming an offset oxidation film layer on an upper part of an electrode layer that has been formed on a semiconductor substrate, forming an upper insulation film layer on an upper part of the offset oxidation film layer, forming an upper insulation film and an offset oxidation film by patterning the upper insulation film layer and the offset oxidation film layer, increasing the cross sectional width of the upper insulation film and insulating exposed surfaces of the offset oxidation film with the upper insulation film, forming electrodes by etching the electrode layer using the enlarged upper insulation film as a mask, and forming a side insulation film layer on exposed surfaces of the electrodes.

With this construction, it is possible to insulate the offset oxidation film as well as the electrodes, because enlarging the cross sectional width of the upper insulation film and insulating exposed surfaces of the offset oxidation film using the upper insulation film is carried out after the upper insulation film and the offset oxidation film have been formed. As a result, neither the electrodes nor the offset oxidation film are etched during formation of the contact holes. Also, since the side insulation film layer is formed on exposed surfaces of the electrodes after formation of the electrodes, the upper insulation film and the side insulation film layer can be made of different materials. Further, the electrodes can be even more reliably insulated because the offset oxidation film is formed on upper surfaces of the electrodes.

If the step of forming the side insulation film layer is a step of forming an oxidation film by subjecting surfaces of the electrodes that have been exposed by etching the electrode layer to oxidation treatment, side surfaces of the electrodes, namely the exposed surfaces, can be insulated by an oxidation film having better insulating properties than a conventional silicon nitride film.

Further, the step of forming the side insulation film layer can comprise steps of forming an oxidation film by subjecting surfaces of the electrodes, that have been exposed by etching the electrode layer to oxidation treatment, removing the oxidation film, and adhering a CVD oxidation film to surfaces of the electrodes that have been exposed by removing the oxidation film. With this construction, the side surfaces of the electrodes can be insulated by a side insulation film layer formed of an oxidation layer including no impurities, because the oxidation layer formed on the electrode surfaces is removed, and a CVD oxidation film is formed on these electrode surfaces.

According to yet another aspect of the present invention, there is provided a method of manufacturing a semiconductor device, comprising the steps of forming an offset oxidation film layer on an upper part of an electrode layer that has been formed on a semiconductor substrate, forming an upper insulation film layer on an upper part of the offset oxidation film layer, forming an upper insulation film by patterning the upper insulation filmlayer, increasing the cross sectional width of the upper insulation film, forming an offset oxidation film by etching the offset oxidation film layer using the enlarged upper insulation film as a mask, forming electrodes by etching the electrode layer using the enlarged upper insulation film and the offset oxidation film as a mask, forming an oxidation film by subjecting surfaces of the electrodes, that have been exposed by etching the electrode layer, to oxidation processing, removing exposed surfaces of the offset oxidation film and the oxidation film and reducing the maximum cross sectional width of the offset oxidation film to less than the maximum cross sectional width of the upper insulation film, and forming a side insulation film layer by adhering a CVD oxidation film on surfaces of the offset oxidation film, that have been exposed by the step of removing exposed surfaces of the offset oxidation film the oxidation film, and surfaces of the electrodes.

With this construction, because an offset oxidation layer is formed by etching the offset oxidation film layer using the enlarged upper insulation film as a mask, after increasing the cross sectional width of the upper insulation film, the cross sectional width of the offset oxidation film and the cross sectional width of the electrodes can be made effectively the same. Also, since the exposed surfaces of the offset oxidation film and the oxidation film are removed and the maximum cross sectional width of the offset oxidation film is reduced to less than the maximum cross sectional width of the upper insulation film, and a side insulation film layer is formed by adhering a CVD oxidation film on exposed surfaces of the offset oxidation film and surfaces of the electrodes, not only the side surfaces and upper surfaces of the electrodes, but also the shoulder portions of the electrodes can be insulated by the oxidation film.

Further, the upper insulation film can be the above described silicon nitride film, BST film or PZT film.

DETAILED DESCRIPTION OF THE INVENTION

Embodiments of a semiconductor device to which the present invention relates, and methods of manufacturing such a semiconductor device, will be described in detail below with reference to the attached drawings. Elements and processes that are considered unnecessary for the understanding of these embodiments, for example processes such as cleaning processing and ion implantation etc., will be omitted from the description.

(First Embodiment)

A first embodiment will be described with reference to FIGS. 1a–1d and FIGS. 2a–2c.

Figure 1A:
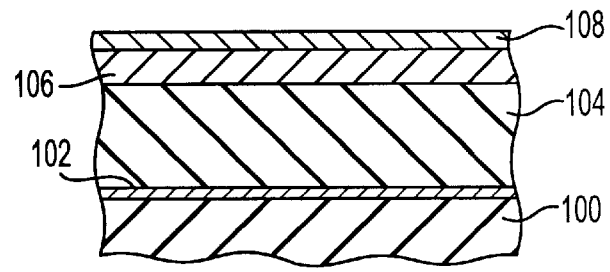
FIGS. 1a–1d are schematics describing a method of manufacturing a semiconductor device according to the present invention.

As shown in FIG. 1a, a gate dielectric film 102, a gate layer 104 formed of polysilicon having a cross sectional thickness of 100–400 nm and constituting an electrode layer, an offset oxidation film layer 106 formed of silicon nitride having a cross sectional thickness of 50–120 nm, and an etching stopper nitride film layer 108 formed of silicon nitride having a cross sectional thickness of 100–150 nm and constituting an upper insulation film layer, are sequentially formed on a silicon substrate 100.

Figure 1B:
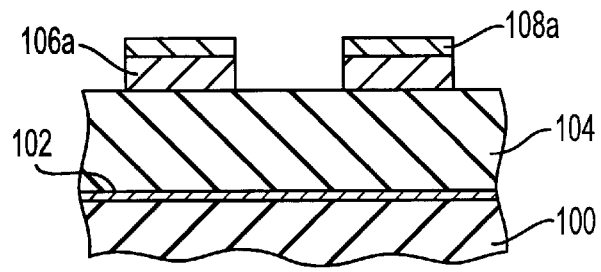

The etching stopper nitride film layer 108 and the offset oxidation film layer 106 then patterned using a photo lithography process, with a photoresist pattern (not shown) that has been formed on the etching stopper nitride film layer 108 as a mask, to form the etching stopper nitride film 108a constituting an upper insulation film layer and an offset oxidation film 106a, as shown in FIG. 1b. FIG. 1b shows the condition after the photoresist pattern has been removed.

In this way, in this embodiment, because the offset oxidation film 106a formed of a CVD oxidation film is formed between a gate 104a, which will be described later, and the etching stopper nitride film 108a, the upper surface of the gate 104a can be covered with an oxidation film having excellent insulating properties.

Figure 1C:
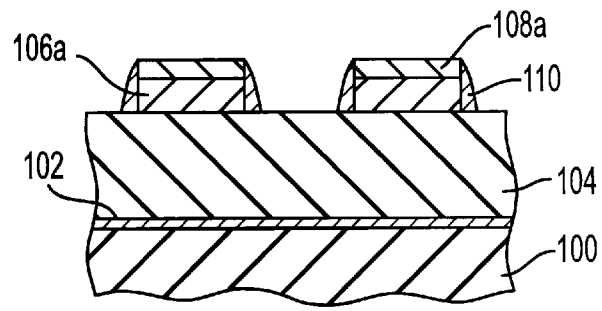

Next, a side wall layer (not shown) constituting an upper insulation film layer and formed of silicon nitride having a cross sectional thickness of 30–70 nm is formed on the silicon substrate 100, and the whole surface is then subjected to etching processing. As a result of each of these processing steps, the sidewall layer remains on only side surfaces of the offset oxidation film 106a and the etching stopper nitride film 108a, as shown in FIG. 1c, to thus form the sidewalls 110. These sidewalls 110 constitute an upper insulation film together with the etching stopper nitride film 108a, and act to prevent etching of the gates 104a when forming contact holes 116, which will be described later.

If the cross sectional width of the sidewalls 110 is equal to the thickness of the above mentioned sidewall layer or within a range of 85% of the thickness of the sidewall layer, it can be suitably set, and at the same time, it can be regulated by appropriately varying the processing conditions when forming the sidewall layer and when etching the entire surface, according to the semiconductor to which this embodiment is applied. Accordingly, the cross sectional width of the sidewalls 110 can be suitably set after setting the cross sectional width of the gate 104a, the distance between gates 104a, internal diameter of the contact holes 116, etc.

Figure 1D:
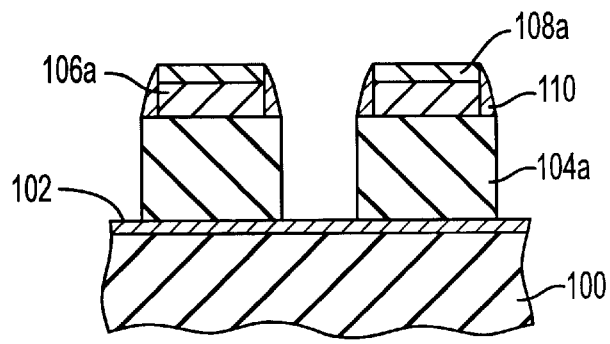

Next the gate layer 104 is patterned without forming a photoresist layer but using the etching stopper nitride film 108a and the sidewalls 110 as a mask, and gate 104a constituting electrodes are formed, as shown in FIG. 1d. As a result, in this embodiment, sidewalls 110 are not formed on side surfaces of the gate 104a. Also, the cross sectional width of the gate 104a is set so as to be a value obtained by adding a value of double the cross sectional width of a sidewall 110 to cross sectional width of either the offset oxidation film 106a or the etching stopper nitride film 108a.

Figure 2A:
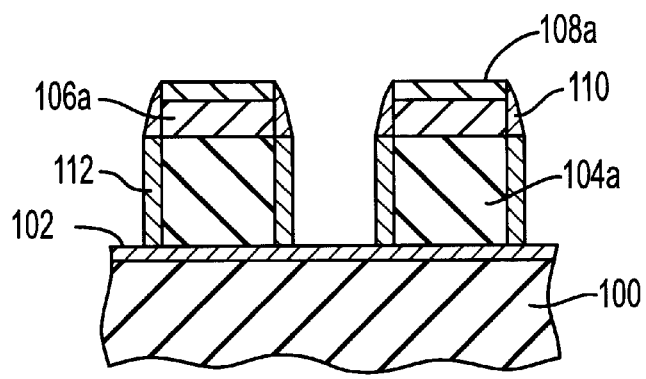
FIGS. 2a–2c are schematics describing the method of manufacturing a semiconductor device according to the present invention.

After that, the surfaces of the polysilicon constituting the gates 104 are subjected to oxidation processing and the side surfaces of the gates 104a are covered with an insulating oxidized polysilicon film (oxidation film) 112 constituting a side insulation film of this embodiment and formed from part of the gates 104a, as shown in FIG. 2a. The cross sectional width of this oxidized polysilicon film 112 can be regulated so that the cross sectional width of the gates 104a after formation of the oxidized polysilicon film 112 is within a range of necessary dimensions for the element characteristics, but from the point of view of preventing damage to the insulation, it is set to 30–70 nm in this embodiment.

When forming the oxidized polysilicon film 112, the silicon nitride constituting the etching stopper nitride film 108a and the sidewalls 110 is not substantially oxidized, which means that the ability of the etching stopper nitride film 108a and the sidewalls 110 to function as an etching stopper film is not diminished. Also, because the polysilicon constituting the gates 104a is oxidized to form the oxidized polysilicon film 112, the cross sectional width of the gates 104a becomes relatively narrow compared to the width before the above mentioned oxidation processing. As a result, a sum of the maximum cross sectional width of the etching stopper nitride film 108a and a value of double the maximum cross sectional width of the sidewalls 110 is larger than the maximum cross sectional width of the gates 104a, which means that the gates 104a are not etched when forming the contact holes 116.

Figure 2B:
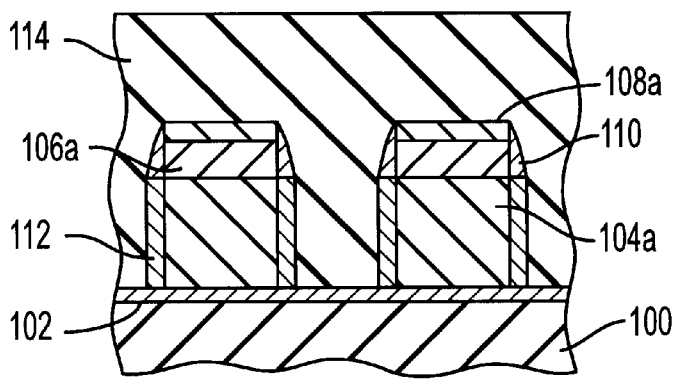

Next, an interlayer insulation film 114 having a cross sectional thickness of 400–1000 nm is formed on the silicon substrate 100, as shown in FIG. 2b, using a film forming process. In this way, the gates 104a are covered by the interlayer insulation film 114. The width of the interlayer insulation film 114 can be suitably set according to the semiconductor device to which the embodiment is applied.

Figure 2C:
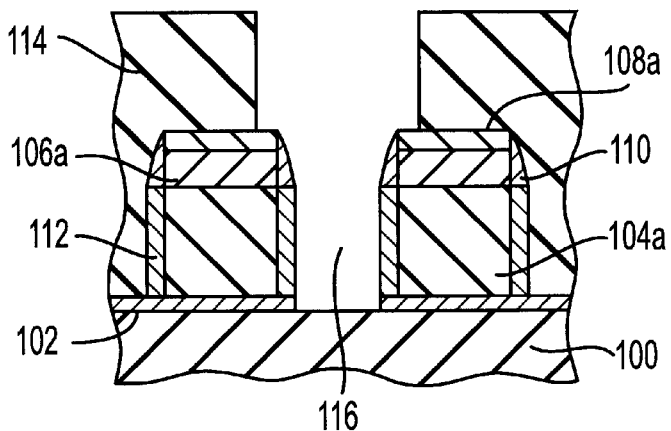

Next, the interlayer insulation film 114 is patterned using a photoresist pattern (not shown) formed on the interlayer insulation film 114, and as shown in FIG. 2c the interlayer insulation film 114 penetrates between the gates 104a in a self aligned manner, and a contact hole 116 is formed communicating with the silicon substrate 100. In this way, in this embodiment, because an SAC structure comprising the etching stopper nitride film 108a and the sidewalls 110 formed at an upper part of the gates 104a has been adopted, fixed contact holes 116 can be formed, even if there is not accurate positioning using the photoresist pattern.

The semiconductor device and method of manufacturing a semiconductor device of this embodiment have the structure as described above, and because the side surfaces of the gates 104a are covered by the oxidized polysilicon film 112 having better insulation properties than a conventional nitride film, leakage current does not flow between the gates 104a and contact portions formed in the contact holes 116. As a result, because the cross sectional width of the oxidized polysilicon film 112 can be made relatively narrow, the distance between each gate 104a can be made narrow. Further, because the offset oxidation film 106a is formed between the gates 104a and the etching stopper nitride film 108a, not only the side walls of the gates 104a but also upper surfaces of the gates 104a can be insulated by the oxidation film having good insulation properties, and a highly reliable semiconductor device can be produced even if the distance between gates 104a is narrow.

Even in the case where the gates 104a are insulated with an oxidation film that is an oxidized polysilicon film 112 instead of the nitride film, because the sum of the cross sectional width of the etching stopper nitride film 108a functioning as an etching stopper film and a value of double the cross sectional width of the sidewalls 110 is wider than the cross sectional width of the gates 104a, the gates 104a are not etched when forming the contact holes 116.

Figure 3:
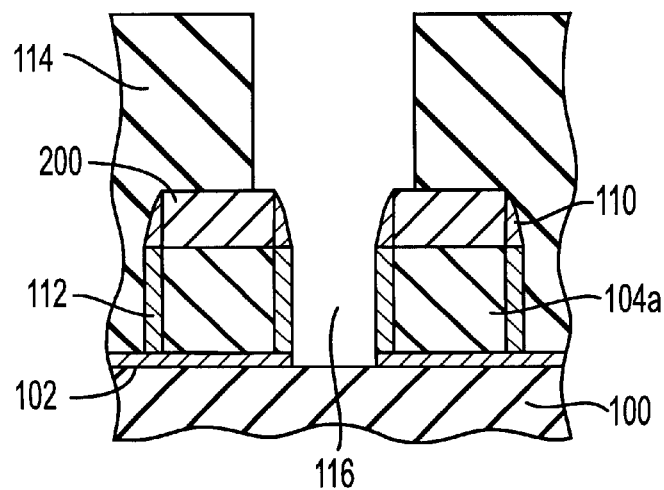
FIG. 3 is a schematic describing another method of manufacturing a semiconductor device according to the present invention.
Figure 4:
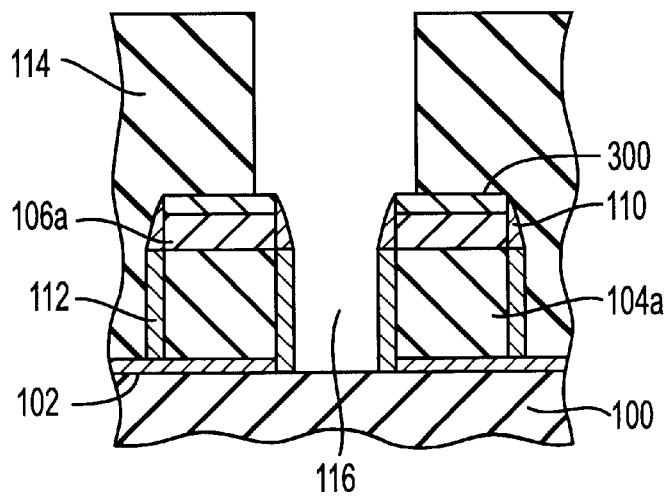
FIG. 4 is a schematic describing another method of manufacturing a semiconductor device according to the present invention.

Another semiconductor device to which the method of this embodiment relates will now be described below with reference to FIG. 3 and FIG. 4. Structural elements that have substantially the same function and structure as in the above described embodiment have the same reference numerals attached thereto, and duplicate description will be omitted. The above described semiconductor device has an offset oxidation film 106a formed between the gates 104a and the etching stopper nitride film 108a, but differing from this, the semiconductor device shown in FIG. 3 does not have the offset oxidation film 106a formed and is characterized by the fact that the etching stopper nitride film 108a is formed directly on the gates 104a. Also, the semiconductor device shown in FIG. 4 is characterized by the fact that a BST film comprised of BST is applied instead of the etching stopper nitride film 108a comprised of nitride film.

First of all, the semiconductor device shown in FIG. 3 will be described. This semiconductor device is different from the above described semiconductor device in that the offset oxidation film 106a is not formed on the gates 104a, and only an etching stopper nitride film 200 having a cross sectional thickness of 100–200 nm is formed. Apart from this difference, the remaining structure is the same as in the above described semiconductor device. With this structure, compared to the above described semiconductor device, the thickness from the upper surface of the etching stopper nitride film 200 to the upper surface of the gates 104a can be made relatively thin, which means that this embodiment can be applied even in a semiconductor where there is a demand for more layers and it must be attempted to make the elements thin.

Next, the semiconductor device shown in FIG. 4 will be described. This semiconductor device has a BST film 300 having a cross sectional thickness of 30–100 formed on the offset oxidation film 106a instead of the above described etching stopper nitride film 108a. This BST film 300 has etching resistant properties compared to the above described etching stopper nitride film 108a, which means that the cross sectional thickness of the BST film 300 can be made relatively thin compared to the etching stopper nitride film 108a.

Because fluoro carbon gas (CF type gas) is generally used as the main gas in the etching process when forming the above described contact holes 116, the etching stopper nitride film 108a formed of silicon nitride can also be etched, depending on etching conditions, and the etching process margin is narrow. The embodiment of FIG. 4 uses as the etching stopper film a BST film 300 which is difficult to etch even in an etching process using CF type gas, so similarly to the case described above the film thickness can be made relatively thin and the process margin can be widened.

As a result, not only can the distance between gates 104a be made narrow, but the semiconductor device can be given an increased number of layers. In this semiconductor device, even in the case where a PZT film is adopted instead of the BST film 300, it is possible to achieve the same effects as with the BST film 300. It is also possible to form side walls comprised of either BST or PZT instead of the sidewalls 110 formed of silicon nitride. In that way, it is possible to improve the etching resistance of the sidewalls, as well as to make the cross sectional width of the sidewalls 110 even more narrow. As a result, it is possible to reduce the distance between gates 104a.

However, the perovskite type material of the BST constituting the BST film 300 and the PZT constituting the PZT film, etc. ferroelectric materials, which means that in cases where capacitive components in the vicinity of the gates 104a must be reduced, it is preferable to adopt the above described etching stopper nitride film 108a formed of silicon nitride and the sidewalls 110. Also, the BST and PZT films have voltage dependency due to high dielectric constant, so it is also preferable to adopt the etching stopper nitride film 108a and sidewalls 110 in cases where voltage dependency is a problem.

(Second Embodiment)

A second embodiment of the invention will now be described below with reference to FIG. 5a–5d. In this embodiment, structural elements that have substantially the same function and structure as in the above described semiconductor device manufacturing method of the first embodiment have the same reference numerals attached thereto, and duplicate description will be omitted.

Figure 5A:
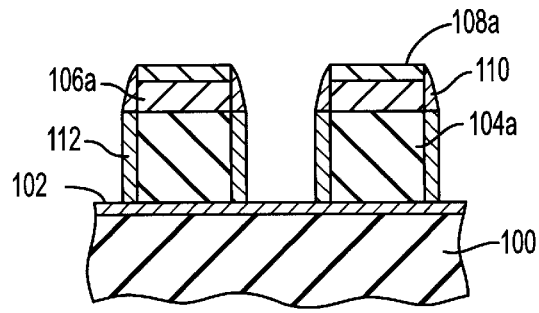
FIGS. 5a–5d are schematics describing another method of manufacturing a semiconductor device according to the present invention.

FIG. 5a shows a semiconductor device constructed in the same way as the semiconductor device in FIG. 2a of the above described first embodiment. That is, a gate dielectric film 102, gates 104a, a offset oxidation film 106a and a etching stopper nitride film 108a are sequentially deposited on a silicon substrate 100 by carrying out each of the above described processes from the process corresponding to FIG. 1a to the process corresponding to FIG. 2a. Sidewalls 110 are also formed on side surfaces of the offset oxidation film 106a and the etching stopper nitride film 108a, and an oxidized polysilicon film 112 is formed on side surfaces of the gates 104a. Accordingly, the sum of the cross sectional width of the etching stopper nitride film 108a and a value of double the cross sectional width of the side walls 110 is larger than the cross sectional width of the gates 104a in this embodiment as well.

Figure 5B:
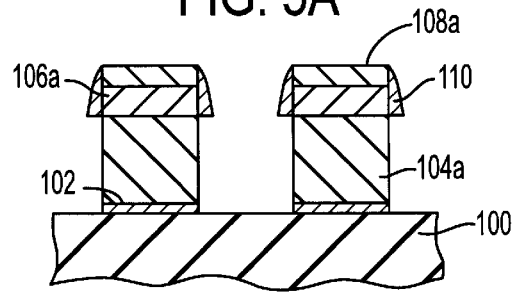

Next, the oxidized polysilicon film 112 covering the side surfaces of the gates 104a is removed by carrying out fluorine processing, as shown in FIG. 5b. In this case, the silicon nitride constituting the sidewalls 110 and the etching stopper nitride film 108a, and the polysilicon constituting the gates 104a are not etched because of the fluorine processing, which means that they exist in the same state as they did before the processing.

Figure 5C:
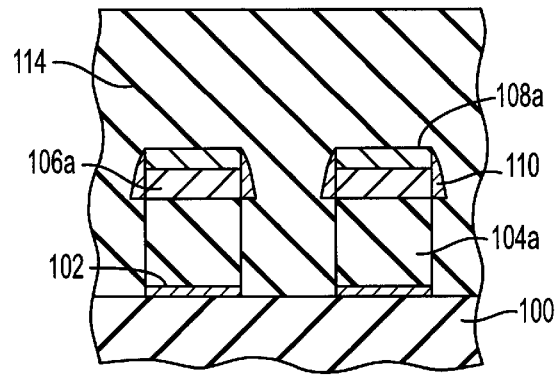

Next, film formation processing is carried out, and an interlayer insulation film 114 is formed on the silicon substrate 100, as shown in FIG. 5c. The gates 104a are covered by the interlayer insulation film 114 as a result of this processing.

Figure 5D:
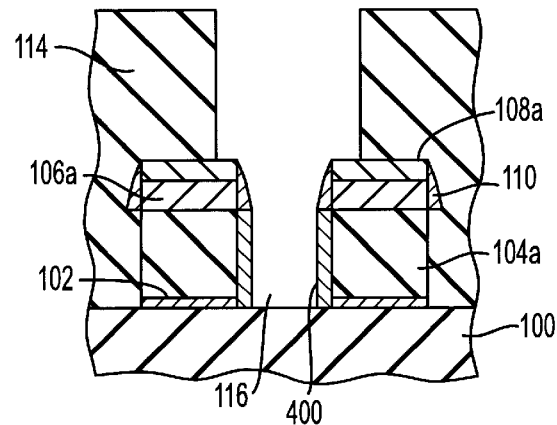

By sequentially carrying out normal photolithography processing and etching processing, the interlayer insulation film 114 penetrates between the gates 104a and contact holes 116 communicating with the silicon substrate 100 are formed, as shown in FIG. 5d. At this time, differing from the above described first embodiment, the side surfaces of the gates 104a are covered by a CVD oxidation film 400 formed by the remaining parts of the interlayer insulation film 114, instead of the oxidized polysilicon film 112.

The method of manufacturing a semiconductor device of this embodiment can prevent impurities such as phosphorus (P) or arsenic (As), that are doped (injected) into the polysilicon constituting the gates 104a, from existing in the oxidation film insulating the gates 104a, because the above described structure of the CVD oxidation film 400 is adopted as an oxidation film insulating the side surfaces of the gates 104a. As a result, the gates 104a are reliably insulated, and a high reliability element can be produced, even if the distance between gates 104a is made narrow.

(Third Embodiment)

Next, a third embodiment will be described with reference to FIGS. 6a–6e and FIGS. 7a–7d. In this embodiment, structural element that have substantially the same function and structure as in the above described semiconductor device manufacturing method of the first or second embodiments have the same reference numerals attached thereto, and duplicate description will be omitted.

Figure 6A:
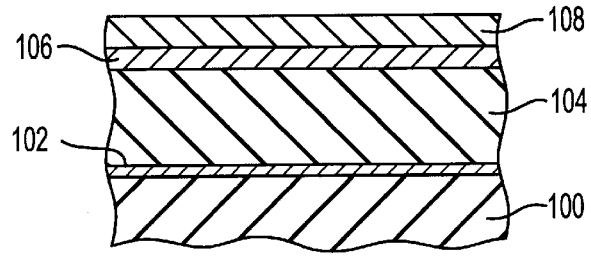
FIGS. 6a–6e are schematics describing another method of manufacturing a semiconductor device according to the present invention.

As shown in FIG. 6a, similarly to the above described first embodiment, agate dielectric film 102, gate layer 104, offset oxidation film layer 106 and etching stopper nitride film layer 108 are sequentially deposited on a silicon substrate 100. In the semiconductor device to which this embodiment relates, differing from the above described first embodiment, the cross sectional thickness of the offset oxidation film layer 106 is set to 30–100 nm, and the cross sectional thickness of the etching stopper nitride film layer 108 is set to 120–200 nm.

Figure 6B:
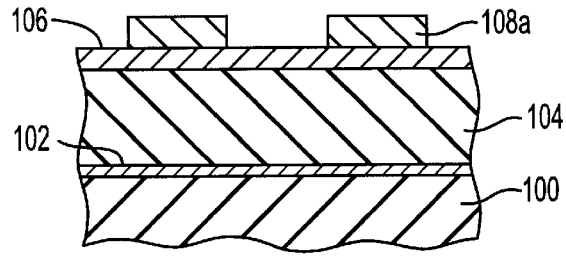

After that, only the etching stopper nitride film layer 108 is patterned to form an etching stopper nitride film 108a, by sequentially carrying out normal photolithography processing and etching processing, as shown in FIG. 6b.

Figure 6C:
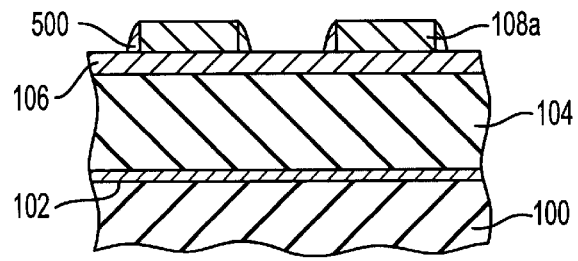

Film formation processing is then carried out, and after a side wall layer, not shown, formed of silicon nitride, is formed to a desired width, for example a cross sectional width of 30–70 nm, the entire surface is etched. In this way, as shown in FIG. 6c, the side wall layer remains on the side surfaces of the etching stopper nitride film 108a, and the side walls 500 to which this embodiment relates are formed.

Figure 6D:
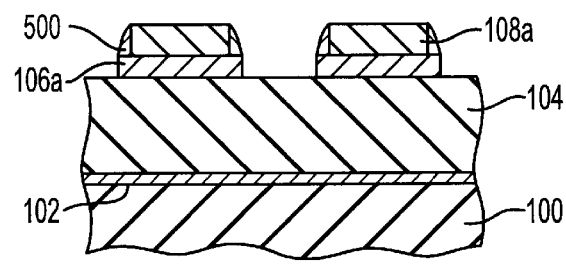

After that, only the offset oxidation film layer 106 is etched using the etching stopper nitride film 108a and the side walls 500 as a mask, and the offset oxidation film 106a is formed as shown in FIG. 6d. Accordingly, in this embodiment, sidewalls 500 are not formed in side surfaces of the offset oxidation film 106a.

Figure 6E:
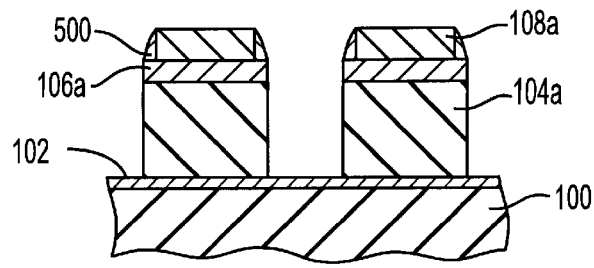

Further, the gate layer 104 is patterned using the etching stopper nitride film 108a, the sidewalls 500 and the offset oxidation film 106a as a mask, and the gates 104a are formed as shown in FIG. 6e. At this time, in the illustrated example, the cross sectional width of the gates 104a and the cross sectional width of the offset oxidation film 106a are substantially the same.

Figure 7A:
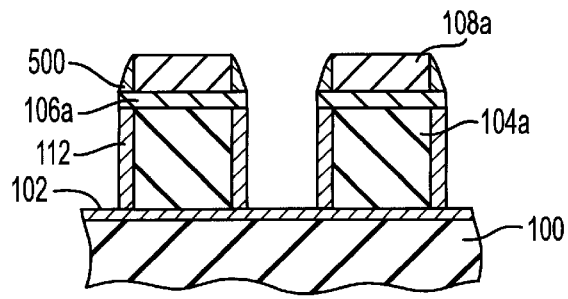
FIGS. 7a–7d are schematics describing another method of manufacturing a semiconductor device according to the present invention.

By carrying out oxidation processing, an oxidized polysilicon film 112 is then formed, as shown in FIG. 7a, by oxidizing the polysilicon of the side surfaces of the gates 104a. Because of this, the sum of the cross sectional width of the etching stopper nitride film 108a and a value of double the cross sectional width of the side walls 500 is wider than the cross sectional width of the gates 104a in this embodiment as well.

Figure 7B:
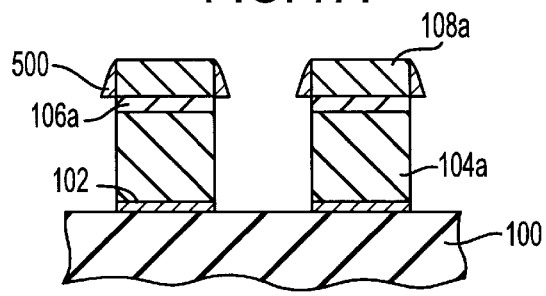

Further, the oxidized polysilicon film 112 formed on the side surfaces the side surfaces of the gates 104a is removed by carrying out fluorine processing, as shown in FIG. 7b. At this time, part of the offset oxidation film 106a, namely part of the side surface portion of the offset oxidation film 106a in the illustrated example, is also removed but in subsequent steps an oxidation film is formed not only on the side surfaces of the gates 104a but also on the side surfaces of the offset oxidation film 106a, so no particular problem arises.

Figure 7C:
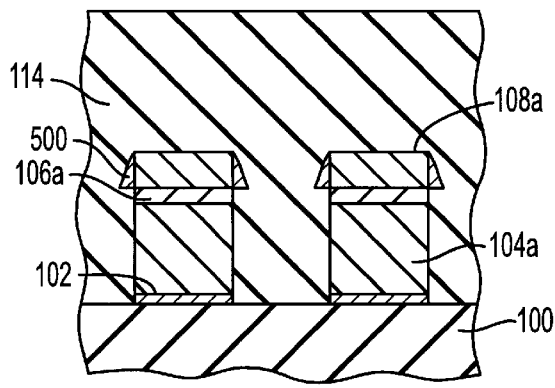

After that, an interlayer insulation film 114 is formed on the silicon substrate 100, as shown in FIG. 7c, by film formation processing. In this way, the gates 104a are completely covered by the interlayer insulation film 114.

Figure 7D:
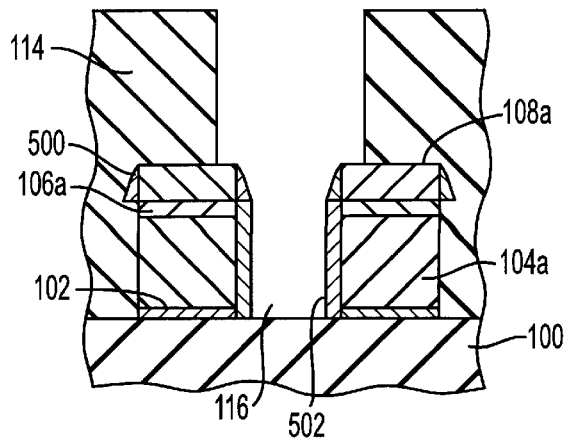
Figure 8:
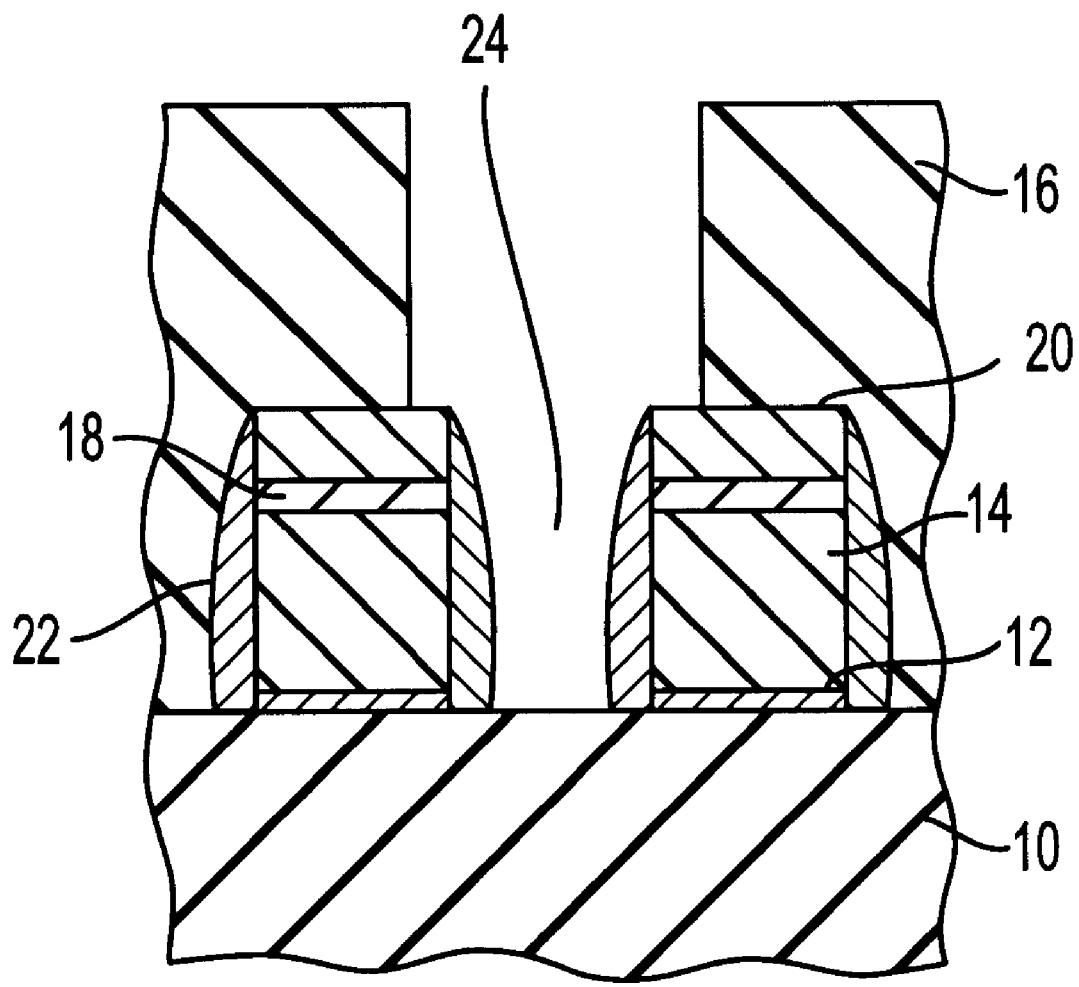
FIG. 8 is a schematic describing a conventional method of manufacturing a semiconductor device.

By sequentially carrying out photolithography processing and etching processing, the interlayer insulation film 114 penetrates between the gates 104a and contact holes 116 are formed communicating with the silicon substrate 100, as shown in FIG. 7d. At this time, in this embodiment, not only the side surfaces of the gates 104a but also the side surfaces of the offset oxidation film 106a are covered by an oxidation film 502 formed by remaining portions of the interlayer insulation film 114.

In the method of manufacturing a semiconductor device of this embodiment, since the oxidation film 502 covers the side surfaces of the offset oxidation film 106a as well as the side surfaces of the gates 104a, it is possible to cover the shoulder portions of the gates 104a with an oxidation film. As a result, not only the side surfaces and upper surfaces of the gates 104a but also the shoulder portions of the gates 104a are insulated by the oxidation film, which means that the gates 104a can be reliably insulated, leakage current does not occur, and the distance between gates 104a can be made narrow.

Preferred embodiments of the present invention have been described above with reference to the attached drawings, but the present invention is not thus limited and it will be understood by those skilled in the art that various modifications are possible thereto within the spirit and scope of the invention, and all such modifications are considered to be within the scope of the invention as determined by the appended claims.

For example, the second embodiment has been described using an example having a structure with an offset oxidation film formed, but the present invention is not thus limited and can also be applied to a semiconductor device in which a offset oxidation film is not formed.

Further, the first embodiment has been described using an example adopting BST film or PZT film in place of the etching stopper nitride film formed of silicon nitride, but the present invention is not thus limited and the BST film and PZT film can also be adopted in the second and third embodiments.

According to the present invention, electrodes are insulated by an upper insulation film and a side insulation film that are formed in separate processing steps, which means that they can be formed from different materials according to the desired function of the upper insulation film and the side insulation film. If the upper insulation film is made from a material having excellent etching resistant properties, the electrodes can be reliably prevented from being etched during formation of contact holes. Also, if the side insulation film is made from an oxidation film having good insulating properties, leakage current can be prevented from flowing between the electrodes and contact portions, and the cross sectional width of the side insulation film can be made narrow. As a result, the distance between each gate 104a can be made narrow, and the integration level of the semiconductor device can be improved. Still further, since the maximum cross sectional width of the upper insulation film can be made wider than the maximum cross sectional width of each electrode, the electrodes will not be etched during formation of contact holes, even if a side insulation film formed of an oxidation film is adopted.

What is claimed is:

1. A method of manufacturing a semiconductor device, comprising the steps of:

forming an upper insulation film layer on an upper portion of an electrode layer formed on a semiconductor substrate;

patterning said upper insulation film layer to form an upper insulation film;

increasing a cross sectional width of said upper insulation film;

forming electrodes by etching said electrode layer using said increased width upper insulation film as a mask; and forming a side insulation film layer, said side insulation film layer being formed by the steps of:

forming an oxidation film by subjecting surfaces of said electrodes, that have been exposed by etching said electrode layer, to oxidation treatment;

removing said oxidation film; and adhering a CVD oxidation film to surfaces of said electrodes that have been exposed by removing said oxidation film.

2. A method of manufacturing a semiconductor device, comprising the steps of:

forming an offset oxidation film layer on an upper part of an electrode layer that has been formed on a semiconductor substrate;

forming an upper insulation film layer on an upper part of said offset oxidation film layer;

forming an upper insulation film and an offset oxidation film by patterning said upper insulation film layer and said offset oxidation film layer;

enlarging a cross sectional width of said upper insulation film and insulating exposed surfaces of said offset oxidation film using said enlarged upper insulation film;

forming electrodes by etching said electrode layer using the enlarged upper insulation film as a mask;

and forming a side insulation film layer on exposed surfaces of said electrodes.

3. The method of manufacturing a semiconductor device as disclosed in claim 2, wherein said step of forming said side insulation film layer is a step of forming an oxidation film by subjecting surfaces of said electrodes, that have been exposed by etching said electrode layer, to oxidation treatment.

4. The method of manufacturing a semiconductor device as disclosed in claim 2, wherein said step of forming said side insulation film layer further comprises the steps of:

forming an oxidation film by subjecting surfaces of said electrodes, that have been exposed by etching said electrode layer to oxidation treatment;

removing said oxidation film; and adhering a CVD oxidation film to surfaces of said electrodes that have been exposed by removing said oxidation film.

5. A method of manufacturing a semiconductor device, comprising the steps of:

forming an offset oxidation film layer on an upper part of an electrode layer that has been formed on a semiconductor substrate;

forming an upper insulation film layer on an upper part of said offset oxidation film layer;

forming an upper insulation film by patterning said upper insulation film layer;

increasing a cross sectional width of said upper insulation film;

forming an offset oxidation film by etching said offset oxidation film layer using said enlarged upper insulation film as a mask;

forming electrodes by etching said electrode layer using said enlarged upper insulation film and said offset oxidation film as a mask;

forming an oxidation film by subjecting surfaces of said electrodes, that have been exposed by etching said electrode layer, to oxidation processing;

removing exposed surfaces of said offset oxidation film and said oxidation film and reducing the maximum cross sectional width of said offset oxidation film to less than a maximum cross sectional width of said upper insulation film; and forming a side insulation film layer by adhering a CVD oxidation film on surfaces of said offset oxidation film, that have been exposed by said step of removing exposed surfaces of said offset oxidation film and said oxidation film, and surfaces of the electrodes.

6. The method of manufacturing a semiconductor device as disclosed in claim 5, wherein said upper insulation film is a silicon nitride film.

* * * * *